United States Patent
Miura et al.

(10) Patent No.: US 10,487,393 B2
(45) Date of Patent: Nov. 26, 2019

(54) SEMICONDUCTOR MANUFACTURING APPARATUS AND METHOD OF MANUFACTURING SEMICONDUCTOR DEVICE

(71) Applicant: Toshiba Memory Corporation, Minato-ku (JP)

(72) Inventors: Tatsuhiko Miura, Yokkaichi (JP); Kazuhiro Murakami, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 10 days.

(21) Appl. No.: 15/699,704

(22) Filed: Sep. 8, 2017

(65) Prior Publication Data
US 2017/0369988 A1 Dec. 28, 2017

Related U.S. Application Data

(62) Division of application No. 14/799,798, filed on Jul. 15, 2015, now Pat. No. 9,758,863.

(30) Foreign Application Priority Data

Mar. 11, 2015 (JP) .................. 2015-048200

(51) Int. Cl.
| | |
|---|---|
| *H01J 37/34* | (2006.01) |
| *C23C 14/35* | (2006.01) |
| *H01L 23/552* | (2006.01) |
| *H01J 37/32* | (2006.01) |
| *C23C 14/34* | (2006.01) |
| *C23C 14/50* | (2006.01) |

(52) U.S. Cl.
CPC .......... *C23C 14/35* (2013.01); *C23C 14/3407* (2013.01); *C23C 14/50* (2013.01);
(Continued)

(58) Field of Classification Search
CPC . H01J 37/3411; H01J 37/345; H01J 37/32715
(Continued)

(56) References Cited

U.S. PATENT DOCUMENTS

| | | | | |
|---|---|---|---|---|
| 5,350,498 A | * | 9/1994 | Smith, Jr. | ......... G02F 1/133719 204/192.15 |
| 6,562,200 B2 | | 5/2003 | Iwase et al. | |

(Continued)

FOREIGN PATENT DOCUMENTS

| | | |
|---|---|---|
| JP | 7-268621 A | 10/1995 |
| JP | 8-8213 | 1/1996 |

(Continued)

OTHER PUBLICATIONS

Combined Office Action and Search Report dated Jun. 20, 2016 in Taiwanese Patent Application No. 104122065 (with English language translation and English translation of Categories of Cited documents).

*Primary Examiner* — Rodney G Mcdonald
(74) *Attorney, Agent, or Firm* — Oblon, McClelland, Maier & Neustadt, L.L.P.

(57) ABSTRACT

In one embodiment, a semiconductor manufacturing apparatus includes a carrier having first and second ends extending in a first direction, and third and fourth ends extending in a second direction and being not shorter than the first and second ends. The apparatus further includes a member holder having a magnet placement face on which first and second magnetic-pole portions are placed, the magnet placement face having fifth and sixth ends extending in the first direction and being shorter than the first and second ends, and seventh and eighth ends extending in the second direction, being longer than the fifth and sixth ends, and being longer than the third and fourth ends. The apparatus further includes a carrier transporter transporting the carrier along the first direction. The carrier transporter can transport the carrier such that the third and fourth ends pass under a center line of the magnet placement face.

8 Claims, 8 Drawing Sheets

(52) U.S. Cl.
CPC ...... *H01J 37/32715* (2013.01); *H01L 23/552* (2013.01); *H01J 37/345* (2013.01); *H01L 2224/04042* (2013.01); *H01L 2224/06135* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/73265* (2013.01); *H01L 2225/0651* (2013.01); *H01L 2225/06506* (2013.01); *H01L 2225/06537* (2013.01); *H01L 2225/06562* (2013.01); *H01L 2924/15311* (2013.01)

(58) Field of Classification Search
USPC .............. 204/192.1, 192.12, 298.23, 298.29; 438/7; 216/54
See application file for complete search history.

(56) References Cited

U.S. PATENT DOCUMENTS

| | | |
|---|---|---|
| 7,964,938 B2 | 6/2011 | Yoon et al. |
| 2001/0023839 A1 | 9/2001 | Kunii et al. |
| 2003/0085122 A1 | 5/2003 | Takahashi |
| 2004/0232109 A1* | 11/2004 | Yoshinaga ............ C23C 14/042 216/54 |
| 2007/0137793 A1 | 6/2007 | Lee |
| 2007/0251449 A1 | 11/2007 | Mizuno et al. |
| 2008/0197015 A1* | 8/2008 | Bluck ................ H01J 37/32009 204/192.12 |
| 2008/0230372 A1* | 9/2008 | Cousins .................. C23C 14/50 204/192.1 |
| 2008/0242087 A1 | 10/2008 | Matsunaka et al. |
| 2013/0270111 A1* | 10/2013 | Park ........................ C23C 14/56 204/298.23 |
| 2014/0093985 A1* | 4/2014 | Li ........................... H01L 22/12 438/7 |

FOREIGN PATENT DOCUMENTS

| | | |
|---|---|---|
| JP | 2002-69634 | 3/2002 |
| JP | 2008-261031 A | 10/2008 |
| JP | 2009-290217 A | 12/2009 |
| JP | 2013-206652 | 10/2013 |
| TW | I221309 B | 9/2004 |

\* cited by examiner

SEMICONDUCTOR MANUFACTURING APPARATUS AND METHOD OF MANUFACTURING SEMICONDUCTOR DEVICE

CROSS REFERENCE TO RELATED APPLICATION

This application is a division of U.S. patent application Ser. No. 14/799,798, filed Jul. 15, 2015, which is based upon and claims the benefit of priority from prior Japanese Patent Application No. 2015-048200, filed on Mar. 11, 2015, the entire contents of each of which are incorporated herein by reference.

FIELD

Embodiments described herein relate to a semiconductor manufacturing apparatus and a method of manufacturing a semiconductor device.

BACKGROUND

Electromagnetic noise generated from a semiconductor chip can be shielded, for example, by covering the semiconductor chip with a metal plate. However, when the semiconductor chip is mounted on a thin device such as a smartphone, there is a concern that the metal plate prevents the thin device from being thinner. Therefore, it is discussed that the electromagnetic noise generated from the semiconductor chip is shielded by forming a metal film on the surface of the semiconductor package by sputtering or the like. In this case, in order to effectively shield the electromagnetic noise, it is desired that the metal film is uniformly formed at an excellent coverage not only on the upper face of the semiconductor package but also on the lateral face of the semiconductor package.

DETAILED DESCRIPTION

Embodiments will now be explained with reference to the accompanying drawings.

In one embodiment, a semiconductor manufacturing apparatus includes a carrier on which a film formation target is mountable, the carrier having first and second ends extending in a first direction, and third and fourth ends extending in a second direction that is different from the first direction and being not shorter than the first and second ends. The apparatus further includes a member holder having a magnet placement face on which one or more first magnetic-pole portions having first polarity and one or more second magnetic-pole portions having second polarity that is different from the first polarity are placed, the magnet placement face having fifth and sixth ends extending in the first direction and seventh and eighth ends extending in the second direction and being longer than the fifth and sixth ends, the member holder being configured to hold, in a vicinity of the first and second magnetic-pole portions, a member that is a material for forming a film on the film formation target. The apparatus further includes a carrier transporter configured to transport the carrier along the first direction below the member holder. Furthermore, the fifth and sixth ends are shorter than the first and second ends, the seventh and eighth ends are longer than the third and fourth ends, and the carrier transporter can transport the carrier such that the third and fourth ends pass under a center line of the magnet placement face, the center line being parallel to the second direction.

(First Embodiment)

Figure 1:
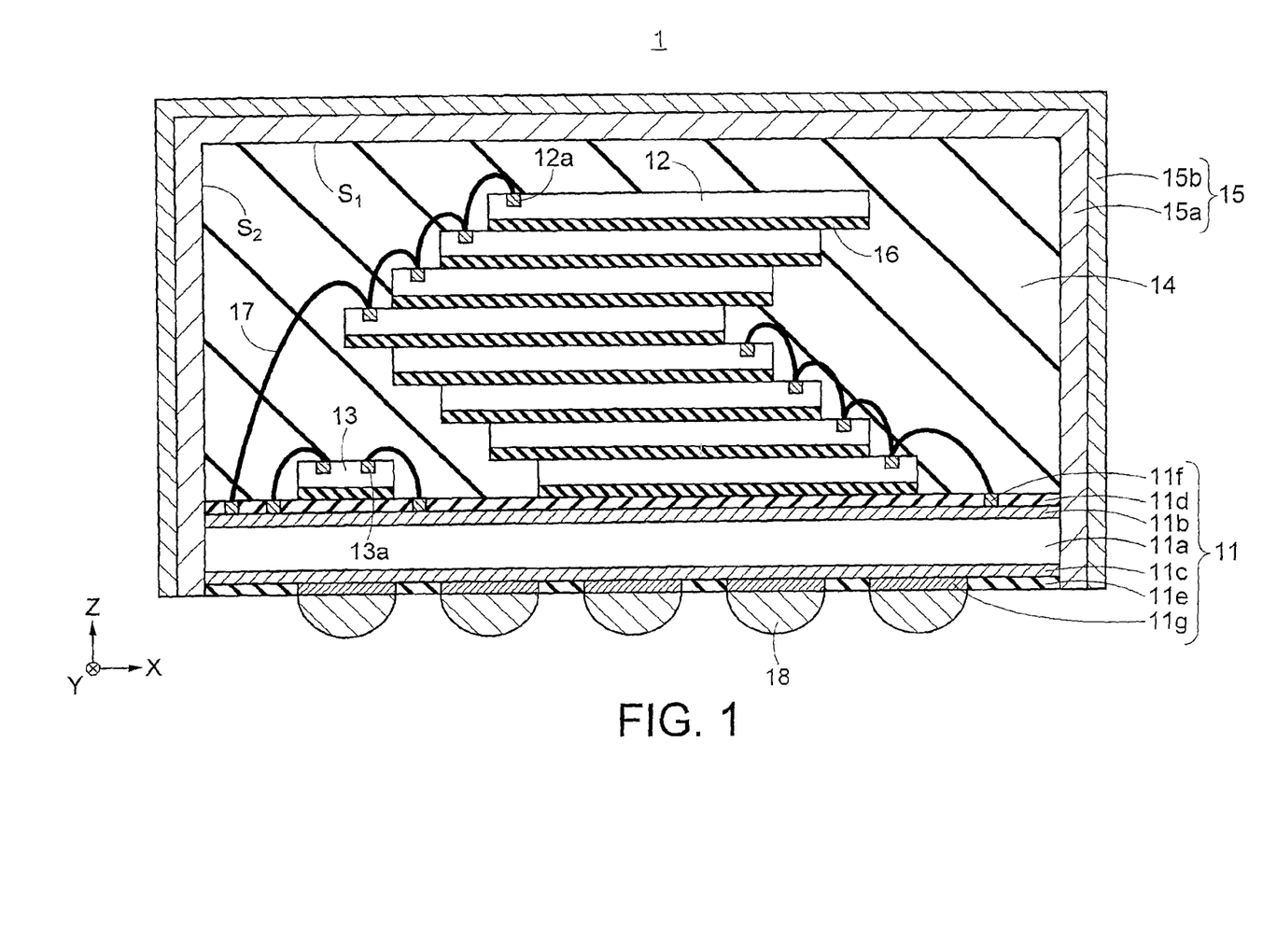
FIG. 1 is a cross-sectional view illustrating a structure of a semiconductor package of a first embodiment.

FIG. 1 is a cross-sectional view illustrating a structure of a semiconductor package 1 of a first embodiment.

The semiconductor package (semiconductor device) 1 in FIG. 1 includes a circuit board 11, semiconductor chips 12, a control chip 13, a sealing layer 14, a shield layer 15, adhesives 16, bonding wires 17 and solder balls 18. The shield layer 15 is an example of a film formed on the semiconductor package 1.

The circuit board 11 includes an insulative substrate 11a, a first line layer 11b formed on an upper face of the insulative substrate 11a, a second line layer 11c formed on a lower face of the insulative substrate 11a, a first insulator 11d covering the first line layer 11b, and a second insulator 11e covering the second line layer 11c. The circuit board 11 further includes pad portions 11f formed in the first insulator 11d and electrically connected to the first line layer 11b, and pad portions 11g formed in the second insulator 11e and electrically connected to the second line layer 11c.

FIG. 1 illustrates an X-direction and a Y-direction which are parallel to upper and lower faces of the circuit board 11 and perpendicular to each other, and a Z-direction which is perpendicular to the upper and lower faces of the circuit board 11. The X-direction is an example of a first direction. The Y-direction is an example of a second direction different from the first direction. In the present specification, the +Z-direction is regarded as an upward direction and the −Z-direction is regarded as a downward direction. For example, positional relation between the first line layer 11b and the second line layer 11c is expressed as that the second line layer 11c is positioned below the first line layer 11b. The −Z-direction of the present embodiment may coincide with the direction of gravity or may not coincide with the direction of gravity.

The semiconductor chips 12 are stacked on the circuit board 11. An example of the semiconductor chips 12 is memory chips. Each semiconductor chip 12 adheres to the circuit board 11 or the lower semiconductor chip 12 with an adhesive 16. A pad portion 12a of each semiconductor chip 12 is electrically connected to a pad portion 11f of the circuit board 11 or a pad portion 12a of another semiconductor chip 12 with a bonding wire 17.

The control chip 13 is also placed on the circuit board 11. The control chip 13 controls operation of the semiconductor chips 12. The control chip 13 adheres to the circuit board 11 with an adhesive 16. Pad portions 13a of the control chip 13 are electrically connected to the pad portions 11f of the circuit board 11 with the bonding wires 17.

The sealing layer 14 is formed on the circuit board 11 to cover the semiconductor chips 12 and the control chip 13. An example of the sealing layer 14 is a resin layer.

The shield layer 15 is formed on an upper face and a lateral face of the semiconductor package 1. Sign $S_1$ designates the upper face of the semiconductor package 1 in the occasion before forming the shield layer 15. Sign $S_2$ designates the lateral face of the semiconductor package 1 in the occasion before forming the shield layer 15. The upper face $S_1$ corresponds to an upper face of the sealing layer 14. The lateral face $S_2$ corresponds to lateral faces of the circuit board 11 and the sealing layer 14. In the present embodiment, in order to prevent peeling-off of the shield layer 15, a surface treatment is performed on the upper face $S_1$ and the lateral face $S_2$ before forming the shield layer 15.

The shield layer 15 of the present embodiment is a metal film having conductivity. The shield layer 15 of the present embodiment includes a first shield layer 15a as an example of a first layer, and a second shield layer 15b as an example of a second layer.

The first shield layer 15a is formed on the upper face $S_1$ and the lateral face $S_2$. An example of the first shield layer 15a is a copper (Cu) layer. The thickness of the first shield layer 15a is, for example, 2.5 μm. The first shield layer 15a of the present embodiment is formed for shielding electromagnetic noise generated from the semiconductor chips 12.

The second shield layer 15b is formed on the upper face $S_1$ and the lateral face $S_2$ through the first shield layer 15a. An example of the second shield layer 15b is a stainless steel (SUS) layer, which contains iron (Fe) and chromium (Cr). The thickness of the second shield layer 15b is, for example, 0.3 μm. The second shield layer 15b of the present embodiment is formed on the surface of the first shield layer 15a for preventing the first shield layer 15a from being discolored due to oxidation.

The solder balls 18 are electrically connected to the pad portions 11g of the circuit board 11. In the present embodiment, the shield layer 15 is formed such that the shield layer 15 is not formed on a lower face of the circuit board 11. The reason is that the solder balls 18 cannot be electrically connected to the pad portions 11g if the shield layer 15 covers the pad portions 11g.

Figure 2:
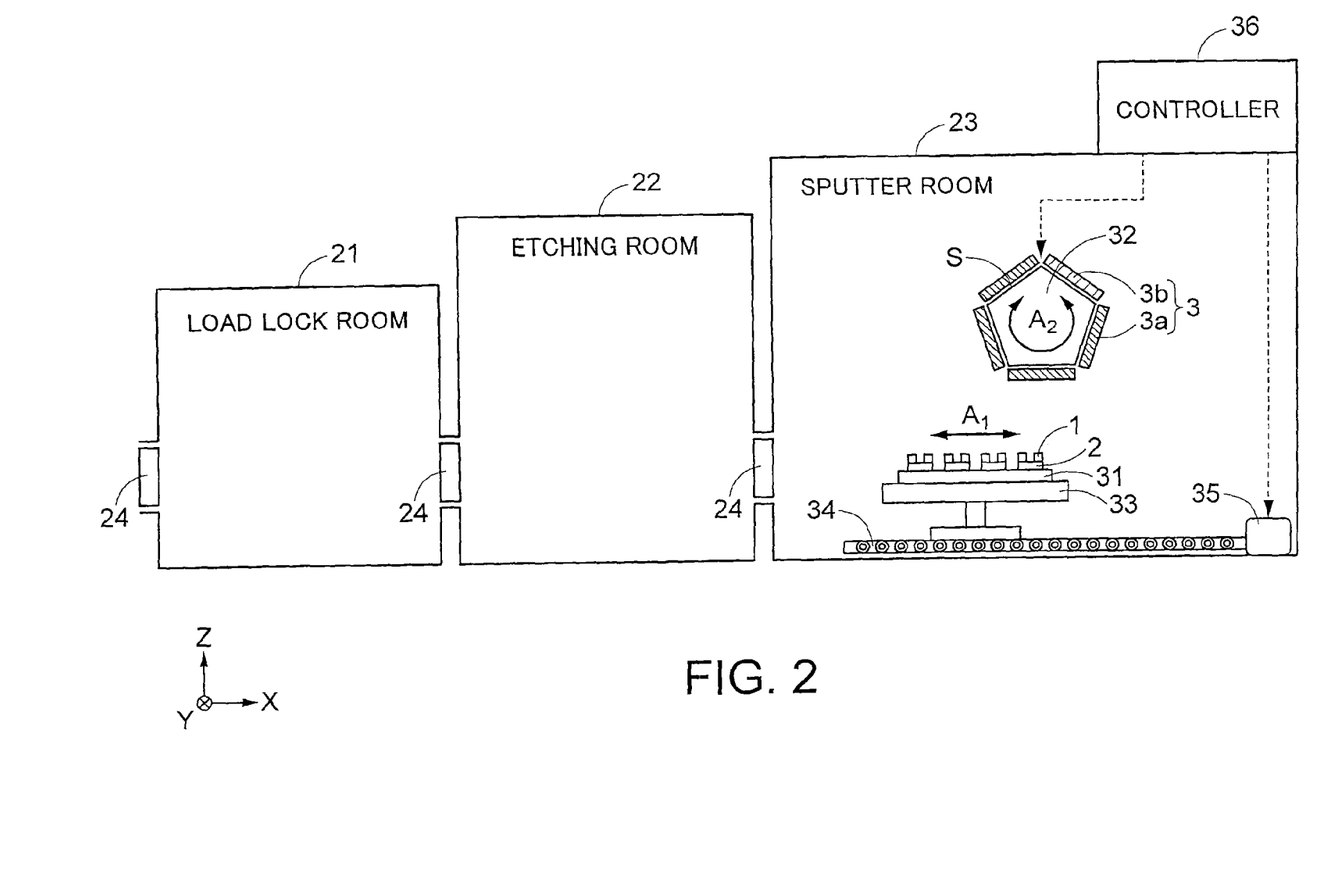
FIG. 2 is a schematic diagram illustrating a structure of a semiconductor manufacturing apparatus of the first embodiment.

FIG. 2 is a schematic diagram illustrating a structure of a semiconductor manufacturing apparatus of the first embodiment. The semiconductor manufacturing apparatus in FIG. 2 is used for forming shield layers 15 on upper faces and lateral faces of plural semiconductor packages 1 that are examples of a film formation target.

The semiconductor manufacturing apparatus in FIG. 2 includes a load lock room 21, an etching room 22 connected to the load lock room 21, and a sputter room 23 connected to the etching room 22. The semiconductor manufacturing apparatus in FIG. 2 further includes openable/closeable partition plates 24 at an entrance of the load lock room 21, a passage between the load lock room 21 and the etching room 22, and a passage between the etching room 22 and the sputter room 23. During processing in the load lock room 21, the etching room 22 and the sputter room 23, the partition plates 24 are closed. In transporting the semiconductor packages 1, the partition plates 24 are opened.

The load lock room 21 includes a transporter that transports the semiconductor packages 1 between the air area and the vacuum area, and a lamp heater that heats the semiconductor packages 1.

The etching room 22 performs the surface treatment on the semiconductor packages 1 with inductively coupled plasma (ICP). Specifically, the etching room 22 performs a treatment of removing an oxide film from the surface of each semiconductor package 1 and a treatment of reforming the surface of each semiconductor package 1 before forming the shield layer 15 on the upper face and the lateral face of each semiconductor package 1.

The sputter room 23 forms the shield layers 15 on the upper faces and the lateral faces of the semiconductor packages 1 by sputtering. The sputter room 23 includes a carrier 31, a target holder 32, a moving stage 33, a belt transporter 34, a motor 35, and a controller 36 for controlling operation of these. The target holder 32 is an example of a member holder. The moving stage 33, the belt transporter 34 and the motor 35 are an example of a carrier transporter.

The carrier 31 is a member on which the plural semiconductor packages 1 are mountable. In the present embodiment, these semiconductor packages 1 are mounted on the carrier 31 for individual trays 2. In FIG. 2, plural trays 2 are mounted on the carrier 31 and the semiconductor packages 1 are mounted on each tray 2. The trays 2 of the present embodiment are formed of aluminum. As indicated by an arrow $A_1$, the semiconductor packages 1 in the present embodiment are collectively transported by the carrier 31.

The target holder 32 has N magnet placement faces S for holding N targets 3, where N is an integer of two or more. While the number of the magnet placement faces S of the present embodiment is 5, it may be other than 5. As mentioned later, one or more S-pole portions and one or more N-pole portions are placed on each magnet placement face S. The target holder 32 holds the targets 3 in the vicinity of the S-pole portions and the N-pole portions on the magnet placement faces S.

The targets 3 are members used as materials for forming the shield layers 15 on the semiconductor packages 1. The target holder 32 of the present embodiment holds first targets 3a for forming first shield layers 15a and a second target 3b for forming second shield layers 15b. In the present embodiment, the first targets 3a are formed of copper (Cu), and the second target 3b is formed of stainless steel (SUS). In FIG. 2, four first targets 3a and one second target 3b are held.

As indicated by an arrow $A_2$, the target holder 32 can rotate around an axis parallel to the Y-direction. The target holder 32 of the present embodiment rotates in a revolver structure. When forming the shield layers 15 with a certain target 3, the target holder 32 rotates such that a magnet placement face S that holds this target 3 faces downward to oppose the carrier 31. The target holder 32 then forms the shield layers 15 on the semiconductor packages 1 on the carrier 31 with the sputtering particles which scatter from the target 3. The target holder 32 of the present embodiment can continuously form the first and second shield layers 15a and 15b by using the first and second targets 3a and 3b.

The moving stage 33 can move in a state where the carrier 31 is mounted on the moving stage 33. The moving stage 33 is placed on the belt transporter 34. The belt transporter 34 is placed below the target holder 32 and can transport the moving stage 33 along the X-direction with power of the motor 35. As indicated by the arrow $A_1$, the belt transporter 34 of the present embodiment can reciprocally move the carrier 31 in the ±X-directions below the target holder 32. A movement speed and a movement range of this reciprocal movement are controlled by the controller 36.

Figure 3:
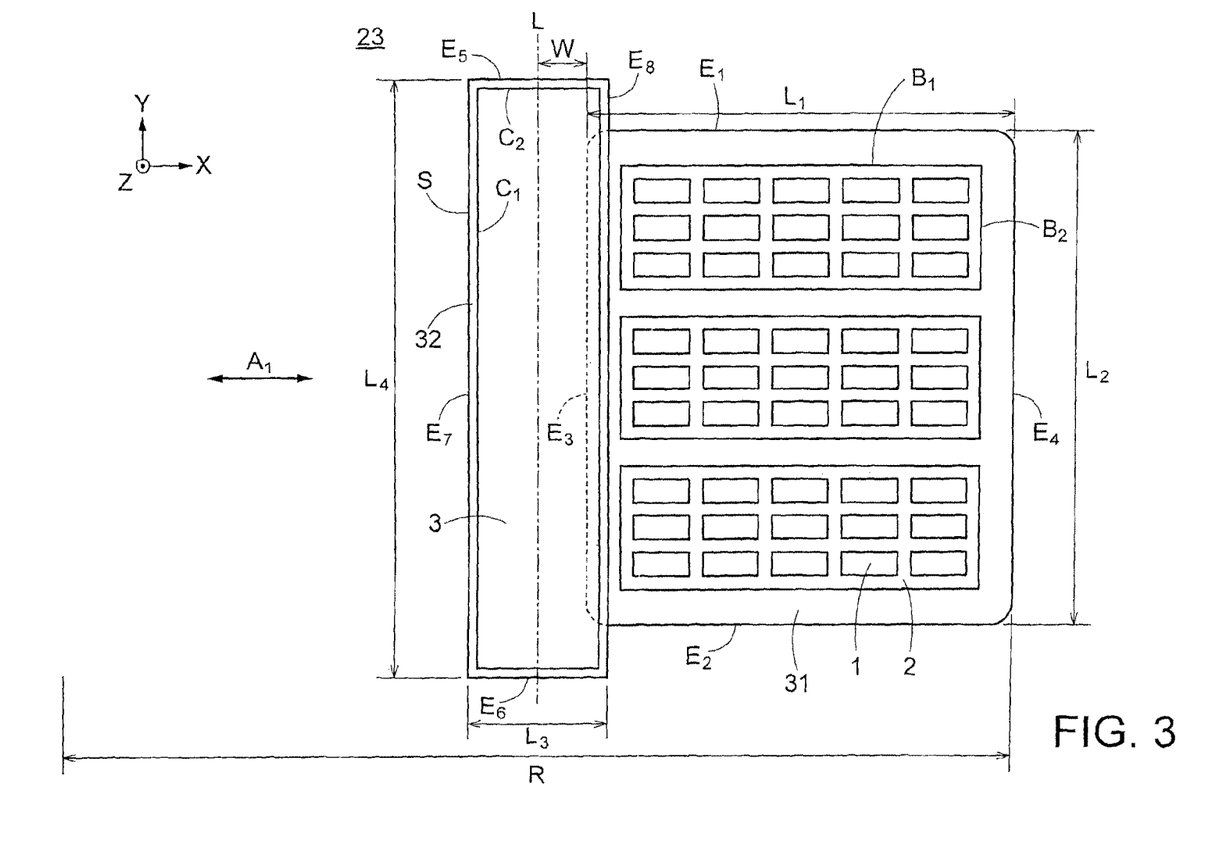
FIG. 3 is a top view illustrating the structure of the semiconductor manufacturing apparatus of the first embodiment.

FIG. 3 is a top view illustrating the structure of the semiconductor manufacturing apparatus of the first embodiment. FIG. 3 illustrates the carrier 31 and the target holder 32 in the sputter room 23.

The carrier 31 of the present embodiment has a rectangular planar shape and has two short sides $E_1$ and $E_2$ extending in the X-direction and two long sides $E_3$ and $E_4$ extending in the Y-direction. The short sides $E_1$ and $E_2$ are an example of first and second ends. The long sides $E_3$ and $E_4$ are an example of third and fourth ends which are not shorter than the first and second ends. A length $L_1$ of the short sides $E_1$ and $E_2$ is, for example, 400 mm. A length $L_2$ of the long sides $E_3$ and $E_4$ is, for example, 600 mm. Relation between the lengths $L_1$ and $L_2$ is represented by $L_1<L_2$.

Each magnet placement face S of the target holder 32 of the present embodiment has a rectangular planar shape and has two short sides $E_5$ and $E_6$ extending in the X-direction and two long sides $E_7$ and $E_8$ extending in the Y-direction. The short sides $E_5$ and $E_6$ are an example of fifth and sixth ends. The long sides $E_7$ and $E_8$ are an example of seventh and eighth ends which are longer than the fifth and sixth ends. Relation between a length $L_3$ of the short sides $E_5$ and $E_6$ and a length $L_4$ of the long sides $E_7$ and $E_8$ is represented by $L_3<L_4$.

In the present embodiment, the length $L_3$ of the short sides $E_5$ and $E_6$ of each magnet placement face S is set shorter than the length $L_1$ of the short sides $E_1$ and $E_2$ of the carrier 31 ($L_3<L_1$). In the present embodiment, the length $L_4$ of the long sides $E_7$ and $E_8$ of each magnet placement face S is set longer than the length $L_2$ of the long sides $E_3$ and $E_4$ of the carrier 31 ($L_4>L_2$).

Each tray 2 of the present embodiment has a rectangular planar shape and has two long sides $B_1$ and two short sides $B_2$. Each tray 2 in FIG. 3 is mounted on the carrier 31 such that the long sides $B_1$ are parallel to the X-direction and the short sides $B_2$ are parallel to the Y-direction. In FIG. 3, the plural trays 2 are mounted on the carrier 31 so as to line up in the Y-direction. Alternatively, these trays 2 may be mounted on the carrier 31 so as to line up in the X-direction (refer to FIG. 2). Moreover, cavities or convex edges may be provided to correspond to the outer shapes of the trays 2 on the upper face of the carrier 31 where the trays 2 are mounted.

Each tray 2 of the present embodiment is a JEDEC standard tray, on which 144 (9×16) semiconductor packages 1 can be contained. In this case, four trays 2 can be mounted on the carrier 31 of the present embodiment, which has dimensions of 400 mm×600 mm, and 576 (144×4) semiconductor packages 1 can be mounted thereon. It should be noted that FIG. 3 illustrates the carrier 31 that three trays 2 are mounted on for convenience of drawing.

Each target 3 of the present embodiment has a rectangular planar shape and has two long sides $C_1$ and two short sides $C_2$. A length of the long sides $C_1$ is, for example, 771 mm. A length of the short sides $C_2$ is, for example, 94 mm. Moreover, a thickness of each target 3 is, for example, 17.5 mm. The length of the short sides $C_2$ of each target 3 is set shorter than the length $L_1$ of the short sides $E_1$ and $E_2$ of the carrier 31. The length of the long sides $C_1$ of each target 3 is set longer than the length $L_2$ of the long sides $E_3$ and $E_4$ of the carrier 31. The target 3 in FIG. 3 is held on the target holder 32 such that the long sides $C_1$ are parallel to the Y-direction and the short sides $C_2$ are parallel to the X-direction.

Sign L designates a center line of the magnet placement face S, the center line L being parallel to the Y-direction in FIG. 3. The center line L is positioned at the center between the two long sides $E_3$ and $E_4$ of the magnet placement face S. The target 3 in FIG. 3 is held such that a center line of the target 3 overlaps with the center line L of the magnet placement face S. Therefore, the center line L is positioned at the center between the two long sides $C_1$ of the target 3.

Sign R designates a movement range in the occasion when the carrier 31 is reciprocally moved. A length of the movement range R of the present embodiment is 840 mm that is longer than twice of the length $L_1$ (400 mm) of the short sides $E_1$ and $E_2$ of the carrier 31. Therefore, every time the carrier 31 moves from one end of the movement range R to the other end thereof, the whole carrier 31 passes under the center line L. Namely, every time the carrier 31 moves from the one end of the movement range R to the other end thereof, both long sides $E_3$ and $E_4$ of the carrier 31 pass under the center line L.

FIG. 3 illustrates a state where the carrier 31 has moved from the left end to the right end. During this movement, both long sides $E_3$ and $E_4$ of the carrier 31 pass under the center line L from the left side to the right side. Sign W designates a distance between the center line L and the carrier 31 in the occasion when the carrier 31 has moved to the left end or the right end. The distance W of the present embodiment is, for example, 20 mm (840/2−400 mm).

It is noted that the long side $E_3$ of the carrier 31 in FIG. 3 is hidden under the magnet placement face S. When the carrier 31 of the present embodiment reciprocally moves, only the long side $E_4$ of the long sides $E_3$ and $E_4$ passes under the long side $E_8$ of the magnet placement face S, and only the long side $E_3$ of the long sides $E_3$ and $E_4$ passes under the long side $E_7$ of the magnet placement face S. This is because the distance W is set shorter than a half of the length $L_3$ ($W<L_3/2$).

When sputtering particles scatter from the target 3 of the target holder 32, the carrier 31 of the present embodiment reciprocally moves. This makes it possible to uniformly form the shield layers 15 at an excellent coverage on the upper faces and the lateral faces of the semiconductor packages 1 on the carrier 31. A movement speed in the occasion of reciprocal movement of the carrier 31 of the present embodiment is, for example, 44 mm/s. Moreover, performance time of one sputtering process of the present embodiment is, for example, 350 seconds.

Figure 4A:
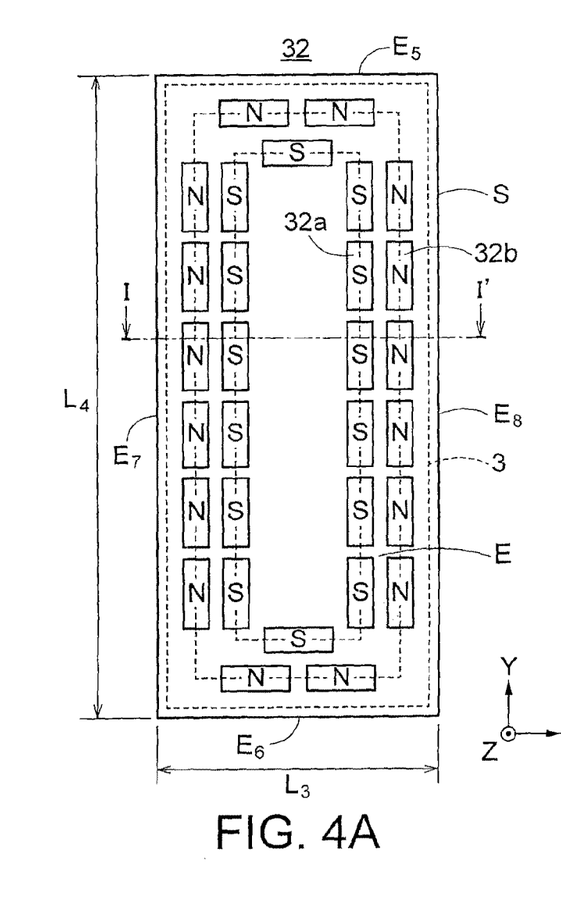
FIGS. 4A and 4B are a top view and a cross-sectional view illustrating a structure of a target holder of the first embodiment.
Figure 4B:
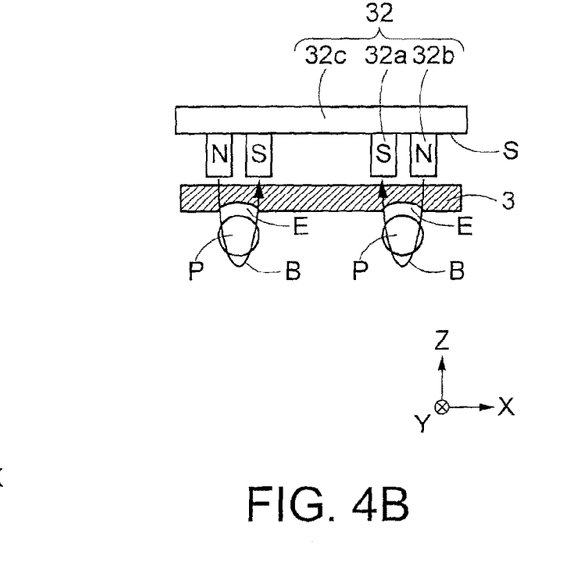

FIGS. 4A and 4B are a top view and a cross-sectional view illustrating a structure of the target holder 32 of the first embodiment.

FIG. 4A is a top view illustrating the magnet placement face S that faces downward and the target 3 that is held on this magnet placement face S. As illustrated in FIG. 4A, plural S-pole portions 32a and plural N-pole portions 32b are placed on each magnet placement face S of the target holder 32. The S-pole portions 32a are an example of one or more first magnetic-port portions having first polarity. The N-pole portions 32b are an example of one or more second magnetic-pole portions having second polarity different from the first polarity.

The S-pole portions 32a are placed to form a first annular shape. Each S-pole portion 32a has a rectangular planar shape and is placed such that the long sides of each S-pole portion 32a are oriented in a direction along this first annular shape. Namely, the long sides of each S-pole portion 32a are parallel to the Y-direction in the vicinity of the long sides $E_7$ and $E_8$ of the magnet placement face S, and are parallel to the X-direction in the vicinity of the short sides $E_5$ and $E_6$ of the magnet placement face S.

The N-pole portions 32b are placed to form a second annular shape surrounding the S-pole portions 32a. Each N-pole portion 32b has a rectangular planar shape and is placed such that the long sides of each N-pole portion 32b are oriented in a direction along this second annular shape. Namely, the long sides of each N-pole portion 32b are parallel to the Y-direction in the vicinity of the long sides $E_7$ and $E_8$ of the magnet placement face S, and are parallel to the X-direction in the vicinity of the short sides $E_5$ and $E_6$ of the magnet placement face S.

Sign E designates an erosion region of the target 3. The erosion region E of the present embodiment is generated between the S-pole portions 32a and the N-pole portions 32b to be annular.

FIG. 4B is a cross-sectional view taken along the line I-I' in FIG. 4A. Sign 32c designates a main body of the target holder 32. The main body 32c of the target holder 32 has the magnet placement face S. Sign B designates magnetic fields generated between the S-pole portions 32a and the N-pole portions 32b. In the present embodiment, under the influence of the magnetic fields B, regions P with high plasma density are generated in the vicinity of regions between the S-pole portions 32a and the N-pole portions 32b. As a result, the erosion region E is generated in the target 3 in the vicinity of the regions P. In the erosion region E, the target 3 is liable to be removed due to the erosion of the target 3. Therefore, a large part of the sputtering particles of the present embodiment are generated in the vicinity of the erosion region E. The erosion of the target 3 becomes gradually deeper as the target 3 is being used.

Figure 5:
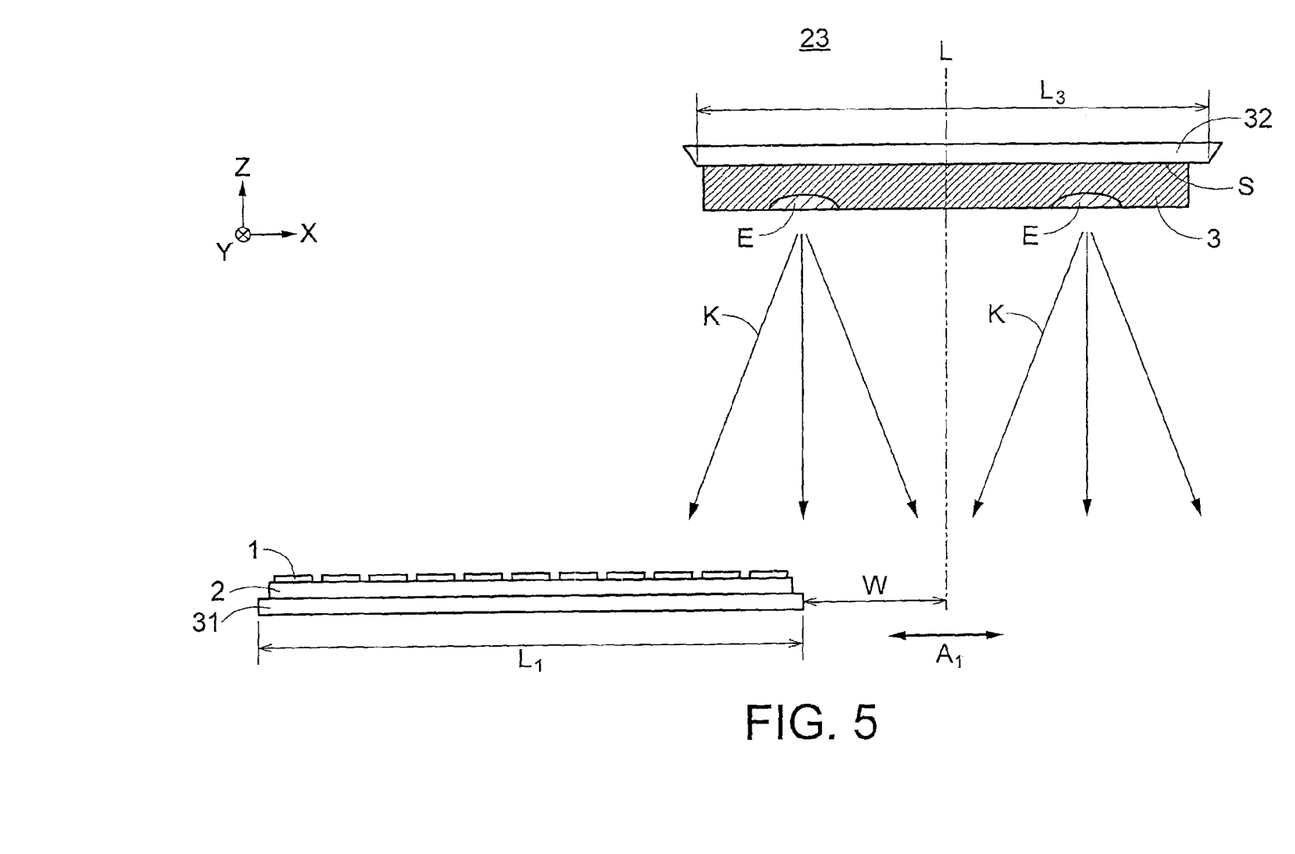
FIG. 5 is a cross-sectional view for explaining operation of the semiconductor manufacturing apparatus of the first embodiment.

FIG. 5 is a cross-sectional view for explaining operation of the semiconductor manufacturing apparatus of the first embodiment.

FIG. 5 illustrates a situation that the sputtering particles scatter on the semiconductor packages 1 on the carrier 31 from the target 3 of the magnet placement face S that faces downward. Arrows K indicate tracks of the sputtering particles scattering from the erosion region E of the target 3. In FIG. 5, the S-pole portions 32a and the N-pole portions 32b are omitted from the illustration for convenience of drawing.

As illustrated in FIG. 5, the sputtering particles contain particles scattering in the vertical direction (−Z-direction) from the erosion region E and particles scattering in oblique directions from the erosion region E. Therefore, in a case where a certain semiconductor package 1 is right under the erosion region E, the shield layer 15 is liable to be formed on the upper face of this semiconductor package 1. On the other hand, in a case where a certain semiconductor package 1 is obliquely below the erosion region E, the shield layer 15 is liable to be formed on the lateral face of this semiconductor package 1.

Accordingly, when the sputtering particles scatter from the target 3, the semiconductor manufacturing apparatus of the present embodiment reciprocally moves the carrier 31. This makes it possible to uniformly form the shield layers 15 at an excellent coverage on the upper faces and the lateral faces of the semiconductor packages 1 on the carrier 31.

Referring to FIG. 3 again, the structure and the operation of the semiconductor manufacturing apparatus of the present embodiment will be described in detail.

The carrier 31 of the present embodiment reciprocally moves in ±X-directions. Moreover, the carrier 31 is disposed such that the short sides $E_1$ and $E_2$ are parallel to the X-direction. Such disposition leads to a merit that the movement range R of the carrier 31 is shorter for the whole carrier 31 passing under the center line L as compared with disposition in which the long sides $E_3$ and $E_4$ are parallel to the X-direction.

Moreover, the magnet placement face S in FIG. 3 is disposed such that the short sides $E_5$ and $E_6$ are parallel to the X-direction. Similarly, the target 3 in FIG. 3 is disposed such that the short sides $C_2$ are parallel to the X-direction. Such disposition leads to a merit that smaller areas of the magnet placement face S and the target 3 can be realized as compared with disposition in which the long sides $E_7$ and $E_8$ and the long sides $C_1$ are parallel to the X-direction.

Furthermore, the long sides $E_7$ and $E_8$ of the magnet placement face S are set longer than the long sides $E_3$ and $E_4$ of the carrier 31. Similarly, the long sides $C_1$ of the target 3 are set longer than the long sides $E_3$ and $E_4$ of the carrier 31. Therefore, according to the present embodiment, the shield layers 15 can be uniformly formed at an excellent coverage both on the semiconductor packages 1 in the vicinity of the short side $E_1$ of the carrier 31 in the +Y-direction and on the semiconductor packages 1 in the vicinity of the short side $E_2$ of the carrier 31 in the −Y-direction.

Moreover, the short sides $E_5$ and $E_6$ of the magnet placement face S are set shorter than the short sides $E_1$ and $E_2$ of the carrier 31. Similarly, the short sides $C_2$ of the target 3 are set shorter than the short sides $E_1$ and $E_2$ of the carrier 31. Such setting leads to a merit that smaller areas of the magnet placement face S and the target 3 can be realized.

Furthermore, once the carrier 31 moves from one end of the movement range R to the other end thereof, both long sides $E_3$ and $E_4$ of the carrier 31 pass under the center line L. Namely, when the carrier 31 moves from the one end of the movement range R to the other end thereof, the whole carrier 31 passes under the center line L. Therefore, according to the present embodiment, the shield layers 15 can be uniformly formed at an excellent coverage both on the semiconductor packages 1 in the vicinity of the long side $E_4$ of the carrier 31 in the +X-direction and on the semiconductor packages 1 in the vicinity of the long side $E_3$ of the carrier 31 in the −X-direction.

Moreover, the carrier 31, the magnet placement face S (main body 32c of the target holder 32) and the target 3 of the present embodiment have rectangular planar shapes extending in the Y-direction. Such structures enable the shield layers 15 to be efficiently formed on the plural semiconductor packages 1 on the carrier 31 in their combination with the operation of the reciprocal movement of the carrier 31 in the ±X-directions. In addition, such structures lead to a merit that a ratio in area of the erosion region E occupied in the target 3 can be increased and utilization efficiency of the target 3 can be enhanced.

Furthermore, in the present embodiment, the distance W in the occasion when the carrier 31 has moved to one end or the other end of the movement range R is set shorter than a half of the length $L_3$ of the short sides $E_5$ and $E_6$ of the magnet placement face S (W<$L_3$/2). Therefore, when the carrier 31 reciprocally moves, only the long side $E_4$ of the long sides $E_3$ and $E_4$ passes under the long side $E_8$ of the magnet placement face S, and only the long side $E_3$ of the long sides $E_3$ and $E_4$ passes under the long side $E_7$ of the magnet placement face S. Such operation leads to a merit that the movement range R of the carrier 31 where the whole carrier 31 passes under the center line L can be made short. Moreover, to make the movement range R of the carrier 31 short can increase the time during which the carrier 31 passes through tracks of all sputtering particles scattering from the target 3. Therefore, sputtering efficiency on the semiconductor packages 1 on the carrier 31 can be enhanced.

Moreover, each tray 2 of the present embodiment is arranged such that its long sides $B_1$ are parallel to the X-direction. Such arrangement leads to a merit that temperature difference between the semiconductor packages 1 on the carrier 31 can be suppressed as compared with arrangement in which the short sides $B_2$ are parallel to the X-direction, since the plural trays 2 simultaneously pass under the center line L.

As described above, the present embodiment makes it possible, by applying such structures and operation to the semiconductor manufacturing apparatus, to form the shield layers 15 high in uniformity on the upper faces and the lateral faces of the plural semiconductor packages 1 on the carrier 31.

According to an experiment, when the shield layers 15 were formed on the plural semiconductor packages 1 on the carrier 31 using the semiconductor manufacturing apparatus of the present embodiment, fluctuation in thickness of the shield layers 15 on these semiconductor packages 1 was able to be suppressed to approximately 10%.

Figure 6A:
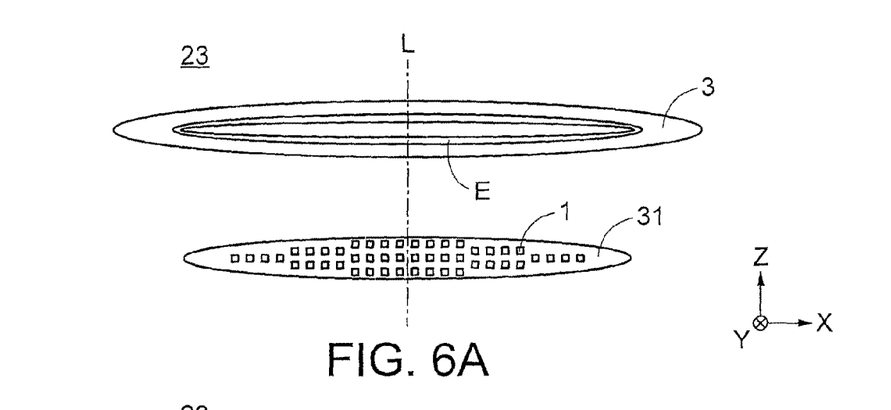
FIGS. 6A and 6B are diagrams for explaining a structure and operation of a semiconductor manufacturing apparatus of a comparative example for the first embodiment.
Figure 6B:
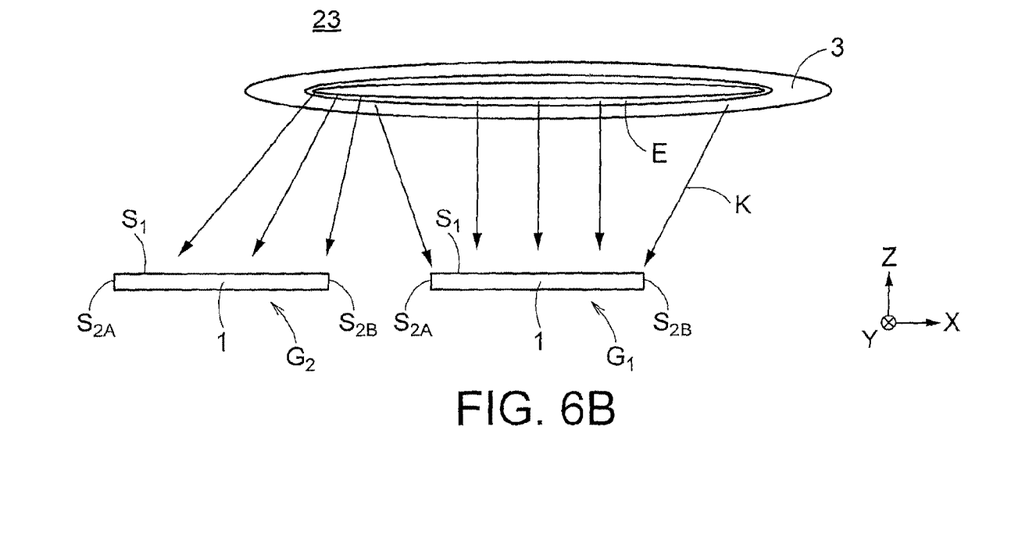

FIGS. 6A and 6B are diagrams for explaining a structure and operation of a semiconductor manufacturing apparatus of a comparative example for the first embodiment.

FIG. 6A illustrates a carrier 31 and a target 3 of the comparative example. The carrier 31 and the target 3 of the comparative example have circular planar shapes. Similarly, the magnet placement face S of the comparative example, which is not shown, has a circular planar shape. Therefore, a circular annular erosion region E is generated in the target 3 of the comparative example.

FIG. 6B schematically illustrates a situation that sputtering particles scatter on semiconductor packages 1 on the carrier 31 from the target 3. In the comparative example, the sputtering process is performed in the state where the carrier 31 stands still.

Sign $G_1$ designates a semiconductor package 1 disposed in the vicinity of the center of the target 3. Sign $G_2$ designates a semiconductor package 1 disposed far from the center of the target 3. In the comparative example, a shield layer 15 can be uniformly formed on the upper face $S_1$ and the lateral face $S_{2A}$ and $S_{2B}$ of the semiconductor package 1 with sign $G_1$. However, a shield layer 15 is hardly formed on the far-side lateral face $S_{2A}$ of the semiconductor package 1 with sign $G_2$. Therefore, the shield layer 15 cannot be uniformly formed on the semiconductor package 1 with sign $G_2$.

Moreover, the planar shapes of the semiconductor packages 1 are typically square or rectangular. Therefore, in the case where the planar shape of the target 3 is circular as in the comparative example, it is difficult for the plural semiconductor packages 1 to be arranged with respect to the target 3 so as to realize excellent sputtering efficiency.

On the other hand, the present embodiment makes it possible, by applying the above-mentioned structures and operation to the semiconductor manufacturing apparatus, to uniformly form the shield layers 15 at an excellent coverage on the upper faces and the lateral faces of the plural semiconductor packages 1 on the carrier 31, and to arrange the plural semiconductor packages 1 with respect to the target 3 so as to realize excellent sputtering efficiency.

(Second Embodiment)

Figure 7:
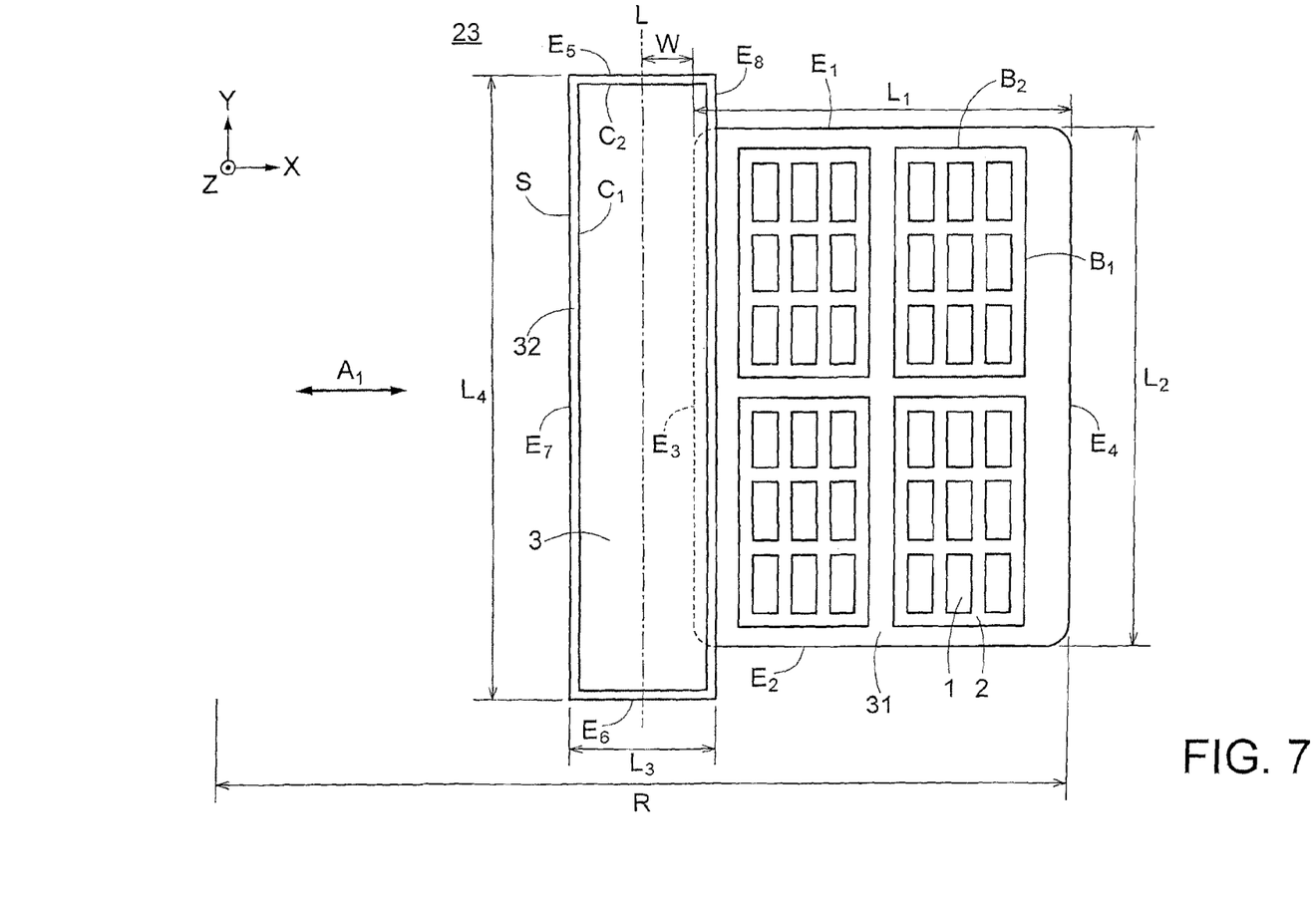
FIG. 7 is a top view illustrating a structure of a semiconductor manufacturing apparatus of a second embodiment.

FIG. 7 is a top view illustrating a structure of a semiconductor manufacturing apparatus of a second embodiment.

In the first embodiment, the plural trays 2 are mounted on the carrier 31 so as to line up in the Y-direction (FIG. 3). Meanwhile, in the second embodiment, the plural trays 2 are mounted on the carrier 31 so as to line up in the X-direction and the Y-direction (FIG. 7).

In this manner, the trays 2 in the first embodiment are arranged so as to line up in one direction. Such arrangement leads to a merit that the trays 2 can be easily placed on the carrier 31 by automatic transportation, for example. Meanwhile, the trays 2 in the second embodiment are arranged so as to line up in two directions. Such arrangement leads to a merit that the trays 2 and the carrier 31 in various shapes can be adopted, for example.

In these embodiments, the plural trays 2 may be mounted on the carrier 31 so as to line up only in the X-direction.

(Third Embodiment)

Figure 8:
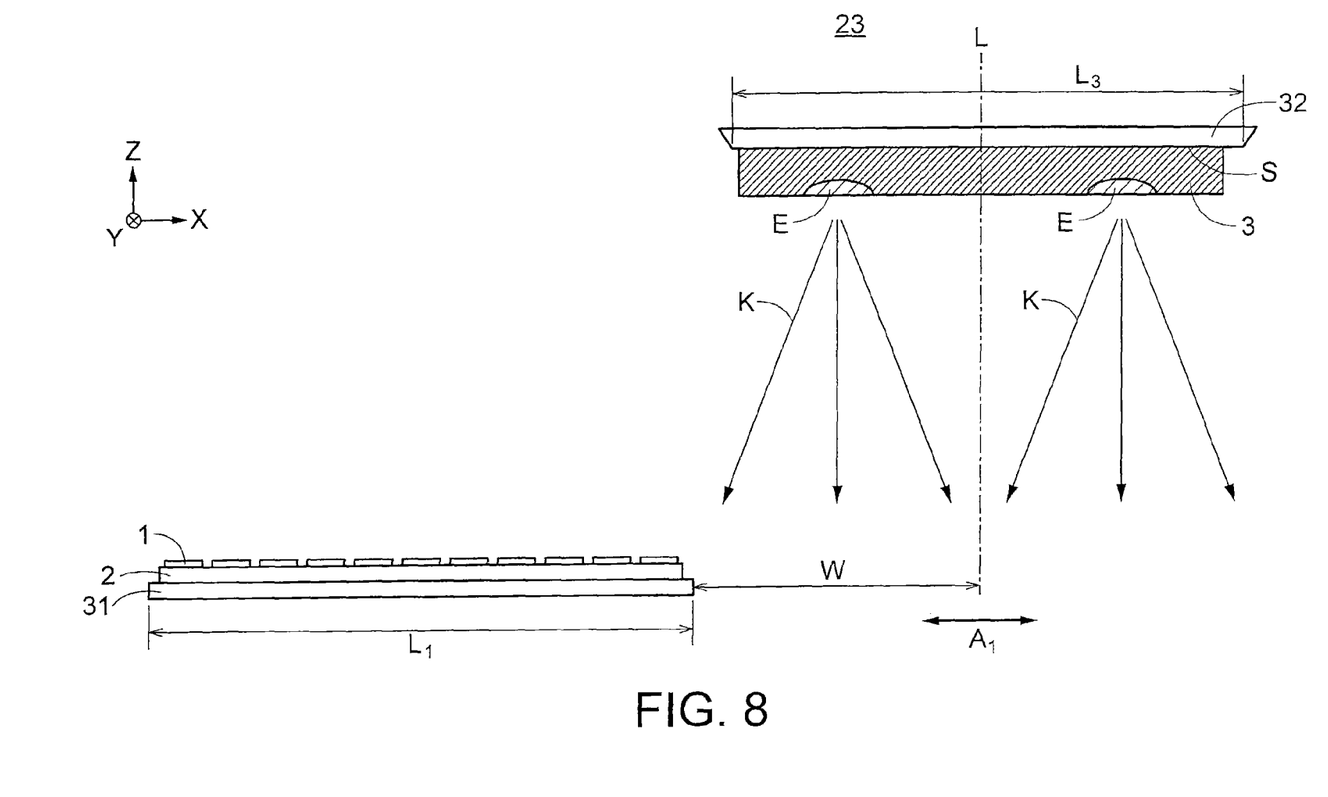
FIG. 8 is a cross-sectional view for explaining operation of a semiconductor manufacturing apparatus of a third embodiment.

FIG. 8 is a cross-sectional view for explaining operation of a semiconductor manufacturing apparatus of a third embodiment.

In the first embodiment, the distance W in the occasion when the carrier 31 has moved to one end of the movement range R or the other end thereof is set shorter than a half of the length $L_3$ of the short sides $E_5$ and $E_6$ of the magnet placement face S (W<$L_3$/2: FIG. 5). The distance W of the first embodiment is, for example, 20 mm.

Meanwhile, the distance W in the third embodiment in the occasion when the carrier 31 has moved to one end of the movement range R or the other end thereof is set longer than a half of the length $L_3$ (W>$L_3$/2: FIG. 8). The distance W of the third embodiment is, for example, 50 mm. Therefore, when the carrier 31 reciprocally moves, both long sides $E_3$ and $E_4$ pass under the long side $E_8$ of the magnet placement face S and pass under the long side $E_7$ of the magnet placement face S (refer to FIG. 3).

With the distance W of the first embodiment, the movement range R of the carrier 31 where the whole carrier 31 passes under the center line L can be made short. On the other hand, with the distance W of the third embodiment, the shield layers 15 can be formed at a more excellent coverage on the lateral faces of the semiconductor packages 1 in the vicinity of the long sides $E_3$ and $E_4$ of the carrier 31.

It is desirable that the distance W is set to a preferable value in consideration of the area and the thickness of each semiconductor package 1.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, including forming a conductive film in a chamber for a film forming process, the method comprising:
   mounting plural semiconductor packages on a carrier, the carrier having first and second ends extending in a first direction and third and fourth ends extending in a second direction that is different from the first direction and being not shorter than the first and second ends;
   holding, in a vicinity of one or more first magnetic-pole portions and one or more second magnetic-pole portions of a member holder, a member that is a material for forming the conductive film on each semiconductor package, the member holder having a magnet placement face on which the first magnetic-pole portions having first polarity and the second magnetic-pole portions having second polarity that is different from the first polarity are placed, the magnet placement face having fifth and sixth ends extending in the first direction and seventh and eighth ends extending in the second direction and being longer than the fifth and sixth ends, the fifth and sixth ends being shorter than the first and second ends, the seventh and eighth ends being longer than the third and fourth ends; and reciprocally moving the carrier in the chamber along the first direction without transporting the carrier out of the chamber such that the third and fourth ends pass under a center line of the magnet placement face in each of a forward movement and a backward movement of the reciprocal movement to form the conductive film on an upper face and a lateral face of each of the plural semiconductor packages when particles from the member scatter on the plural semiconductor packages transported into the chamber, the center line being parallel to the second direction, wherein the carrier reciprocally moves such that only one of the third and fourth ends passes under the seventh end and only the other of the third and fourth ends passes under the eighth end, when the particles scatter on the plural semiconductor packages from the member.

2. The method of claim 1, wherein the conductive film includes a first layer and a second layer provided on a surface of the first layer.

3. The method of claim 2, wherein the first layer contains copper, and the second layer contains iron.

4. The method of claim 1, wherein plural trays each containing the plural semiconductor packages are mountable on the carrier.

5. The method of claim 4, wherein the trays includes aluminum.

6. The method of claim 1, wherein a planar shape of the member is rectangular, and the member has a short side shorter than the first and second ends and a long side longer than the third and fourth ends.

7. The method of claim 1, wherein the carrier in the reciprocal movement faces the member held by the member holder such that an upper face of the carrier is parallel with a lower face of the member.

8. The method of claim 1, wherein a distance between the center line of the magnet placement face and the carrier when the carrier is at one end or the other end of a movement range is less than half of a length of the fifth and sixth ends of the magnet placement face, such that $W < L_3/2$, where $W$ is the distance between the center line of the magnet placement face and the carrier, and $L_3$ is the length of the fifth and sixth ends of the magnet placement face.

* * * * *